(12) United States Patent
Negishi

(10) Patent No.: US 6,504,782 B1
(45) Date of Patent: Jan. 7, 2003

(54) SEMICONDUCTOR MEMORY APPARATUS THAT CAN PREVENT WRITE LEVEL OF DATA TO MEMORY CELL FROM DROPPING AND IMPROVE SENSE SPEED AT NEXT CYCLE

(75) Inventor: Tatsuya Negishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/633,133

(22) Filed: Aug. 4, 2000

(30) Foreign Application Priority Data

Aug. 17, 1999 (JP) .......................................... 11-230271

(51) Int. Cl.$^7$ ................................................ G11C 7/00
(52) U.S. Cl. ...................................... 365/226; 365/227
(58) Field of Search ................................. 365/226, 227; 327/535, 530, 53, 66

(56) References Cited

U.S. PATENT DOCUMENTS

| 5,557,232 A | 9/1996 | Shimogawa ................. 327/545 |
| 6,041,012 A | 3/2000 | Banbe et al. ................ 365/226 |
| 6,078,531 A * | 6/2000 | Miyazima et al. .......... 365/226 |
| 6,087,891 A * | 7/2000 | Yoon et al. .................. 327/530 |
| 6,163,493 A * | 12/2000 | Yamagata et al. .......... 365/226 |

FOREIGN PATENT DOCUMENTS

| JP | 02-244488 | 9/1990 |
| JP | 5-334879 | 12/1993 |
| JP | 7-57427 | 3/1995 |
| JP | 10-55667 | 2/1998 |
| JP | 10055667 A * | 2/1998 |
| JP | 10-302492 | 11/1998 |
| JP | 11-213664 | 8/1999 |
| JP | 11-213667 | 8/1999 |
| WO | 97/24729 | 7/1997 |

* cited by examiner

Primary Examiner—Amir Zarabian
Assistant Examiner—VanThu Nguyen
(74) Attorney, Agent, or Firm—Foley & Lardner

(57) ABSTRACT

A semiconductor memory apparatus includes a memory cell array section, a first power supply generating circuit and a second power supply generating circuit. The first power supply generating circuit supplies a first power supply voltage of the memory cell array section. The second power supply generating circuit supplies a second power supply voltage of a write amplifier. The write amplifier transmits a write data to the memory cell array section. The first power supply generating circuit and the second power supply generating circuit are independent of each other.

27 Claims, 7 Drawing Sheets

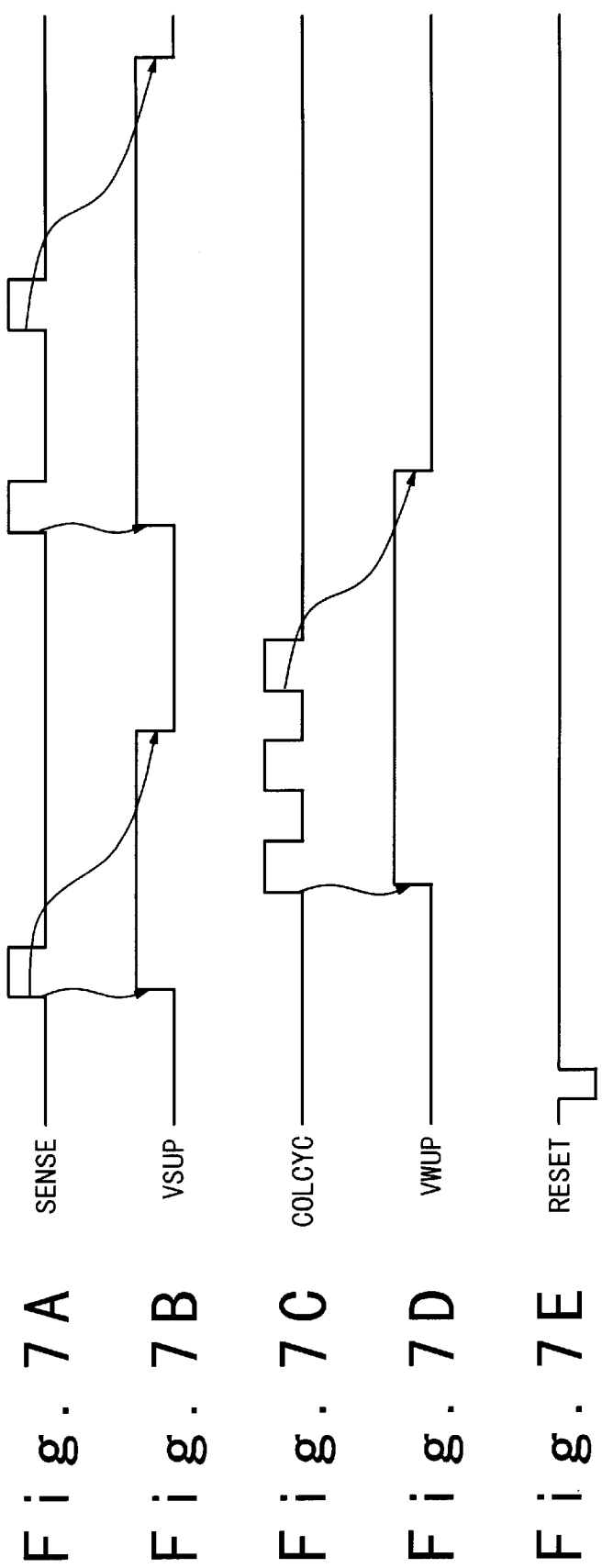

SEMICONDUCTOR MEMORY APPARATUS THAT CAN PREVENT WRITE LEVEL OF DATA TO MEMORY CELL FROM DROPPING AND IMPROVE SENSE SPEED AT NEXT CYCLE

BACKGROUND OF THE INVENTION

1. Field of the Invention

The present invention relates to a semiconductor memory apparatus. More particularly, the present invention relates to a semiconductor memory apparatus that can prevent a write level of data to a memory cell from dropping and improve a sense speed at a next cycle.

2. Description of the Related Art

A memory capacity or storage capacity of DRAM has increased year by year, which has promoted a hyperfine structure of MOSFET. So, in order to insure the reliability of a transistor and reduce the consumptive electric power, a solution is employed for generating a step-down power supply of a certain level from an external power supply to use as a power supply in an inner circuit.

In this case, a power supply having the same level is used in a memory cell array section and a write amplifier for sending a write data inputted from an external portion to the memory cell array section.

Here, if a plurality of banks exist in the memory cell array section, and at the same time, one bank is at a low active state and in another bank a write operation can be carried out, and a part of or all of the plurality of banks are memories using the same power supply, a sense noise and a noise when the write amplifier is actuated have influence on the inner step-down power supply. Thus, it is difficult to maintain the step-down power supply level.

If the power supply level is dropped or reduced, a re-write level of a data, which is read out from a cell at the time of the actuation of the sense amplifier, to the cell is dropped that causes the deterioration of a speed when the cell data is read out.

Japanese Laid Open Patent Application (JP-A-Heisei, 10-55667) discloses the following semiconductor memory apparatus. This is provided with: a first inner voltage generator for supplying a voltage to a condenser of a memory cell; an inner voltage step-down circuit for supplying an operational power supply voltage to respective circuit sections except the memory section; and a second inner voltage generator for generating a voltage to amplify a signal read out on a bit line. Apart from a drive voltage of each circuit, it is possible to make a voltage of a signal that is re-written by a self-refresh higher to make a charge retaining performance higher and thereby enlarge an inner operation period of the self-refresh. The separation between a voltage to amplify a signal with regard to a memory information and a voltage to drive a transistor in the circuit enables the enlargement of the self-refresh period and the reduction of a consumptive current in one self-refresh operation. Hence, it is possible to reduce the consumptive electric power at a time of the operation in the self-refresh.

WO 97/24729 discloses the following dynamic type RAM. This generates a first inner voltage so as to provide a difference substantially equal to a threshold voltage of an address selection MOSFET of a dynamic type memory cell with respect to a power supply voltage, and sends as an operation voltage on a high level side to a sense amplifier. Also, this generates a second inner voltage so as to provide a predetermined difference from a ground potential of a circuit, and sends as an operation voltage on a low level side to the sense amplifier. Then, a write signal having a high level corresponding to the first inner voltage and a low level corresponding to the second inner voltage is generated by a write amplifier, and transmitted to a complementary data line to which the dynamic type memory cell is connected. So, the high level such as the power supply voltage as a selection level and the low level such as the ground potential of the circuit as a non-selection level are sent to a word line to which the dynamic type memory cell is connected.

Also, the WO 97/24729 discloses the following items. A sense amplifier and a write buffer circuit are driven by receiving an inner voltage VSG and an inner voltage VDL generated by a voltage generator composed of a VSG voltage generator and a VDL voltage generator. The write buffer circuit is a circuit for writing the information of the high level or the low level to the respective memory cells in a memory mat.

The sense amplifier has a pair of input and output nodes connected to the complement bit lines, and amplifies a read out signal of a micro signal level, which is read out to a corresponding bit line from the memory cell selected by the word line selection, to a high level or a low level. The sense amplifier also amplifies a signal applied to the bit line from the write circuit when a data is written so that the signal becomes at predetermined high and low levels at an early time. Thus, the data read out from the selected memory cell is again written through the bit line to the memory cell after a level of the data is recovered by the amplification operation of the sense amplifier. Also, the write data is amplified by the sense amplifier to be written to the memory cell after its level is changed into a high level and a low level of a predetermined level.

Japanese Laid Open Patent Application (JP-A-Heisei, 10-302492) discloses the following semiconductor integrated circuit apparatus. This is provided with: a booster 1 for boosting an external power supply voltage Vccext; a level detector for detecting a voltage variation of a boosting voltage Vccint; an inner voltage generator for generating an inner voltage Vccint based on the boosting voltage Vccint; an address buffer; an address decoder; and a memory cell array having an EEPROM configuration. The level detector has a first level detector for detecting a level at a time of a memory access and a second level detector for detecting a level at a time of standby. At the standby, the inner voltage generator short-circuits the boosting voltage Vccint and the inner voltage Vccint. The second level detector is smaller in consumptive electric power than the first level detector. Thus, the consumptive electric power at the standby can be reduced without the drop of a drive voltage.

Japanese Laid Open Patent Application (JP-A-Heisei, 5-334879) discloses the following semiconductor memory apparatus This is provided with a step-down circuit for generating an inner power supply voltage Vint and a standby mode judging circuit for monitoring the inner power supply voltage Vint. The step-down circuit has a compensation driver circuit in addition to an active driver circuit and a standby driver circuit. The compensation driver circuit compensates a component corresponding to a current increase in an inner circuit at the standby mode. Thus, this does not require a power cut function required in the conventional technique in order to protect the increase of the current in the inner circuit. Moreover, this avoids a drop of the inner power supply voltage Vint that is liable to occur at this time. Hence, the semiconductor memory apparatus of the present invention is operated stably at a high speed.

Japanese Laid Open Patent Application (JP-A-Heisei, 7-57472) discloses the following semiconductor integrated circuit apparatus. This is provided with: a receiver circuit for making a level of a first output signal have a two-value state based on a level of a write enable signal of SRAM; a switching circuit for switching a level of a second output signal to any one of an external power supply voltage and a value equal to a predetermined inner power supply voltage based on the level of the first output signal; and a step-down circuit for generating a voltage having a value equal to the level of the second output signal of the switching circuit from an external power supply voltage, and sending to an inner signal processor. Then, a reference voltage having a level lower than an "L" level of the write enable signal when the SRAM is usually operated is applied to another input end of the receiver circuit.

SUMMARY OF THE INVENTION

The present invention is accomplished in view of the above mentioned problems. Therefore, an object of the present invention is to provide a semiconductor memory apparatus that can prevent a write level of data to a memory cell from dropping and improve a sense speed at a next cycle.

In order to achieve an aspect of the present invention, a semiconductor memory apparatus, includes: a memory cell array section; a first power supply generating circuit supplying a first power supply voltage of the memory cell array section; and a second power supply generating circuit supplying a second power supply voltage of a write amplifier transmitting a write data to the memory cell array section, and wherein the first power supply generating circuit and the second power supply generating circuit are independent of each other.

In this case, the memory cell array section includes a plurality of banks, and wherein the first power supply generating circuit supplies the first power supply voltage to a driver actuating a sense amplifier provided with each of the plurality of banks, and wherein the second power supply generating circuit supplies the second power supply voltage to the write amplifier provided with each of the plurality of banks.

Also in this case, the first power supply voltage is a step-down voltage from an external power supply.

Further in this case, the second power supply voltage is a step-down voltage from an external power supply and a same voltage as the first power supply voltage.

In this case, the first power supply generating circuit controls a supplying amount of the first power supply voltage in response to a first control signal.

Also in this case, the first power supply generating circuit controls a supplying amount of the first power supply voltage in response to a first control signal.

In order to achieve another aspect of the present invention, a semiconductor memory apparatus further includes: a first control circuit outputting the first control signal, and wherein the first control circuit includes: a first inverter inputting a sense start signal indicative of a start of a sense operation performed by a sense amplifier; a first flip-flop circuit having first and second NAND circuits; a first delay element inputting the first control signal; and a second inverter inputting an output signal from the first delay element, and wherein the first NAND circuit inputs an output signal from the first inverter and an output signal from the second NAND circuit to output the first control signal, and wherein the second NAND circuit inputs the first control signal outputted from the first NAND circuit, an output signal from the second inverter and a reset signal to set an initiate state of the first flip-flop circuit.

In order to achieve still another aspect of the present invention, a semiconductor memory apparatus further includes: a first control circuit outputting the first control signal, and wherein the first control circuit includes: a first inverter inputting a sense start signal indicative of a start of a sense operation performed by the sense amplifier; a first flip-flop circuit having first and second NAND circuits; a first delay element inputting the first control signal; and a second inverter inputting an output signal from the first delay element, and wherein the first NAND circuit inputs an output signal from the first inverter and an output signal from the second NAND circuit to output the first control signal, and wherein the second NAND circuit inputs the first control signal outputted from the first NAND circuit, an output signal from the second inverter and a reset signal to set an initiate state of the first flip-flop circuit.

In this case, the first delay element delays a signal inputted to the first delay element by a predetermined time, and wherein the predetermined time is a time that elapsed before a completion of the sense operation performed by the sense amplifier after the sense start signal is inputted to the first control circuit.

Also in this case, the first delay element delays a signal inputted to the first delay element by a predetermined time, and wherein the predetermined time is a time that elapsed before a completion of the sense operation performed by the sense amplifier after the sense start signal is inputted to the first control circuit.

Further in this case, the first power supply generating circuit supplies a step-down voltage from an external power supply as the first power supply voltage and includes a first current mirror circuit and a first output transistor, and wherein the first current mirror circuit have first, second, third, fourth, fifth, and sixth transistors, each of the first, second, third, fourth, fifth, and sixth transistors having first and second electrodes and a control electrode, and wherein the second electrode of the first transistor is connected to the external power supply and the control electrode of the first transistor is connected to the first electrode of the first transistor, and wherein the second electrode of the second transistor is connected to the external power supply and the control electrode of the second transistor is connected to the control electrode of the first transistor, and wherein the first electrode of the third transistor is connected to the first electrode of the first transistor, and wherein the first electrode of the fourth transistor is connected to the first electrode of the second transistor and the control electrode of the fourth transistor is connected to a reference voltage of the first power supply voltage and the second electrode of the fourth transistor is connected to the second electrode of the third transistor, and wherein the first electrode of the fifth transistor is connected to the second electrode of the third transistor and the control electrode of the fifth transistor inputs the first control signal and the second electrode of the fifth transistor is connected to a first potential, and wherein the first electrode of the sixth transistor is connected to the second electrode of the fourth transistor and the control electrode of the sixth transistor is connected to the external power supply and the second electrode of the sixth transistor is connected to the first potential, and wherein the second electrode of the first output transistor is connected to the external power supply and the control electrode of the first output transistor is connected to the first electrode of the second transistor and the first electrode of the first output transistor is connected to the control electrode of the third transistor to output the first power supply voltage, and wherein a transistor size of the fifth transistor is different from a transistor size of the sixth transistor.

In this case, the first power supply generating circuit supplies a step-down voltage from an external power supply as the first power supply voltage and includes a first current mirror circuit and a first output transistor, and wherein the first current mirror circuit have first, second, third, fourth, fifth, and sixth transistors, each of the first, second, third, fourth, fifth, and sixth transistors having first and second electrodes and a control electrode, and wherein the second electrode of the first transistor is connected to the external power supply and the control electrode of the first transistor is connected to the first electrode of the first transistor, and wherein the second electrode of the second transistor is connected to the external power supply and the control electrode of the second transistor is connected to the control electrode of the first transistor, and wherein the first electrode of the third transistor is connected to the first electrode of the first transistor, and wherein the first electrode of the fourth transistor is connected to the first electrode of the second transistor and the control electrode of the fourth transistor is connected to a reference voltage of the first power supply voltage and the second electrode of the fourth transistor is connected to the second electrode of the third transistor, and wherein the first electrode of the fifth transistor is connected to the second electrode of the third transistor and the control electrode of the fifth transistor inputs the first control signal and the second electrode of the fifth transistor is connected to a first potential, and wherein the first electrode of the sixth transistor is connected to the second electrode of the fourth transistor and the control electrode of the sixth transistor is connected to the external power supply and the second electrode of the sixth transistor is connected to the first potential, and wherein the second electrode of the first output transistor is connected to the external power supply and the control electrode of the first output transistor is connected to the first electrode of the second transistor and the first electrode of the first output transistor is connected to the control electrode of the third transistor to output the first power supply voltage, and wherein a transistor size of the fifth transistor is different from a transistor size of the sixth transistor.

Also in this case, the second power supply generating circuit controls a supplying amount of the second power supply voltage in response to a second control signal.

Further in this case, the second power supply generating circuit controls a supplying amount of the second power supply voltage in response to a second control signal.

In order to achieve yet still another aspect of the present invention, a semiconductor memory apparatus, further includes: a second control circuit outputting the second control signal, and wherein the second control circuit includes: a third inverter inputting a column start signal indicative of a start of a write and read operation performed by the write amplifier; a second flip-flop circuit having third and fourth NAND circuits; a second delay element inputting the second control signal; and a fourth inverter inputting an output signal from the second delay element, and wherein the third NAND circuit inputs an output signal from the third inverter and an output signal from the fourth NAND circuit to output the second control signal, and wherein the fourth NAND circuit inputs the second control signal outputted from the third NAND circuit, an output signal from the fourth inverter and a reset signal to set an initiate state of the second flip-flop circuit.

In order to achieve another aspect of the present invention, a semiconductor memory apparatus, further includes: a second control circuit outputting the second control signal, and wherein the second control circuit includes: a third inverter inputting a column start signal indicative of a start of a write and read operation performed by the write amplifier; a second flip-flop circuit having third and fourth NAND circuits; a second delay element inputting the second control signal; and a fourth inverter inputting an output signal from the second delay element, and wherein the third NAND circuit inputs an output signal from the third inverter and an output signal from the fourth NAND circuit to output the second control signal, and wherein the fourth NAND circuit inputs the second control signal outputted from the third NAND circuit, an output signal from the fourth inverter and a reset signal to set an initiate state of the second flip-flop circuit.

In this case, the second delay element delays a signal inputted to the second delay element by a preset time, and wherein the preset time is a time that elapsed before completions of the write and read operation performed by the write amplifier and a pre-charge in a data bus provided between the write amplifier and the memory cell array section after the column start signal is inputted to the second control circuit.

Also in this case, the second delay element delays a signal inputted to the second delay element by a preset time, and wherein the preset time is a time that elapsed before completions of the write and read operation performed by the write amplifier and a pre-charge in a data bus provided between the write amplifier and the memory cell array section after the column start signal is inputted to the second control circuit.

Further in this case, the second power supply generating circuit supplies a step-down voltage from an external power supply as the second power supply voltage and includes a second current mirror circuit and a second output transistor, and wherein the second current mirror circuit have seventh, eighth, ninth, tenth, eleventh and twelfth transistors, each of the seventh, eighth, ninth, tenth, eleventh and twelfth transistors having first and second electrodes and a control electrode, and wherein the second electrode of the seventh transistor is connected to the external power supply and the control electrode of the seventh transistor is connected to the first electrode of the seventh transistor, and wherein the second electrode of the eighth transistor is connected to the external power supply and the control electrode of the eighth transistor is connected to the control electrode of the seventh transistor, and wherein the first electrode of the ninth transistor is connected to the first electrode of the seventh transistor, and wherein the first electrode of the tenth transistor is connected to the first electrode of the eighth transistor and the control electrode of the tenth transistor is connected to a reference voltage of the second power supply voltage and the second electrode of the tenth transistor is connected to the second electrode of the ninth transistor, and wherein the first electrode of the eleventh transistor is connected to the second electrode of the ninth transistor and the control electrode of the eleventh transistor inputs the second control signal and the second electrode of the eleventh transistor is connected to a first potential, and wherein the first electrode of the twelfth transistor is connected to the second electrode of the tenth transistor and the control electrode of the twelfth transistor is connected to the external power supply and the second electrode of the twelfth transistor is connected to the first potential, and wherein the second electrode of the second output transistor is connected to the external power supply and the control electrode of the second output transistor is connected to the first electrode of the eighth transistor and the first electrode of the second output transistor is connected to the control electrode of the ninth transistor to output the second power supply voltage, and wherein a transistor size of the eleventh transistor is different from a transistor size of the twelfth transistor.

In this case, the second power supply generating circuit supplies a step-down voltage from an external power supply as the second power supply voltage and includes a second current mirror circuit and a second output transistor, and wherein the second current mirror circuit have seventh, eighth, ninth, tenth, eleventh and twelfth transistors, each of the seventh, eighth, ninth, tenth, eleventh and twelfth transistors having first and second electrodes and a control electrode, and wherein the second electrode of the seventh transistor is connected to the external power supply and the control electrode of the seventh transistor is connected to the first electrode of the seventh transistor, and wherein the second electrode of the eighth transistor is connected to the external power supply and the control electrode of the eighth transistor is connected to the control electrode of the seventh transistor, and wherein the first electrode of the ninth transistor is connected to the first electrode of the seventh transistor, and wherein the first electrode of the tenth transistor is connected to the first electrode of the eighth transistor and the control electrode of the tenth transistor is connected to a reference voltage of the second power supply voltage and the second electrode of the tenth transistor is connected to the second electrode of the ninth transistor, and wherein the first electrode of the eleventh transistor is connected to the second electrode of the ninth transistor and the control electrode of the eleventh transistor inputs the second control signal and the second electrode of the eleventh transistor is connected to a first potential, and wherein the first electrode of the twelfth transistor is connected to the second electrode of the tenth transistor and the control electrode of the twelfth transistor is connected to the external power supply and the second electrode of the twelfth transistor is connected to the first potential, and wherein the second electrode of the second output transistor is connected to the external power supply and the control electrode of the second output transistor is connected to the first electrode of the eighth transistor and the first electrode of the second output transistor is connected to the control electrode of the ninth transistor to output the second power supply voltage, and wherein a transistor size of the eleventh transistor is different from a transistor size of the twelfth transistor.

In order to achieve yet still another aspect of the present invention, a semiconductor memory apparatus, includes: a memory cell array section; a first power supply generating circuit supplying a first power supply voltage for a driver actuating a sense amplifier; and a second power supply generating circuit supplying a second power supply voltage for a write amplifier transmitting a write data from an external to the memory cell array section, and wherein the first power supply generating circuit and the second power supply generating circuit supply the first and second power supply voltages, independently of each other.

In the present invention, if a large capacity of a memory uses a step-down power supply from an external power supply as a power supply for a memory cell array section, voltage generators different from each other supply a power supply of a write amplifier for transmitting a write data inputted from an external portion to the memory cell array section and a power supply for the memory cell array section, respectively.

The present invention separately provides a VINTS generator VIS for supplying a power supply VINTS of an actuation driver TP2 of a sense amplifier SA on which a write level of a data to a memory cell C0 depends and a VINTW generator VIW for supplying a power supply VINTW of a write amplifier WAn−1 for driving write data WDn−1(n=0, 1, . . . ). This fact enables the drops of the power supply levels VINTS and VINTW to be suppressed, and can protect the drop of the write level to the cell C0 and also improve a sense speed at a next cycle.

BRIEF DESCRIPTION OF THE DRAWINGS

FIG. 7A is a timing view showing a sense start signal SENSE in the embodiment of the semiconductor memory apparatus in the present invention;

FIG. 7B is a timing view showing a control signal VSUP in the embodiment of the semiconductor memory apparatus in the present invention;

FIG. 7C is a timing view showing a column start signal COLCYC in the embodiment of the semiconductor memory apparatus in the present invention;

FIG. 7D is a timing view showing a control signal VWUP in the embodiment of the semiconductor memory apparatus in the present invention; and FIG. 7E is a timing view showing a reset signal RESET in the embodiment of the semiconductor memory apparatus in the present invention.

DESCRIPTION OF THE PREFERRED EMBODIMENTS

An embodiment of a semiconductor memory apparatus in the present invention will be described below in detail with reference to the attached drawings.

Figure 1:
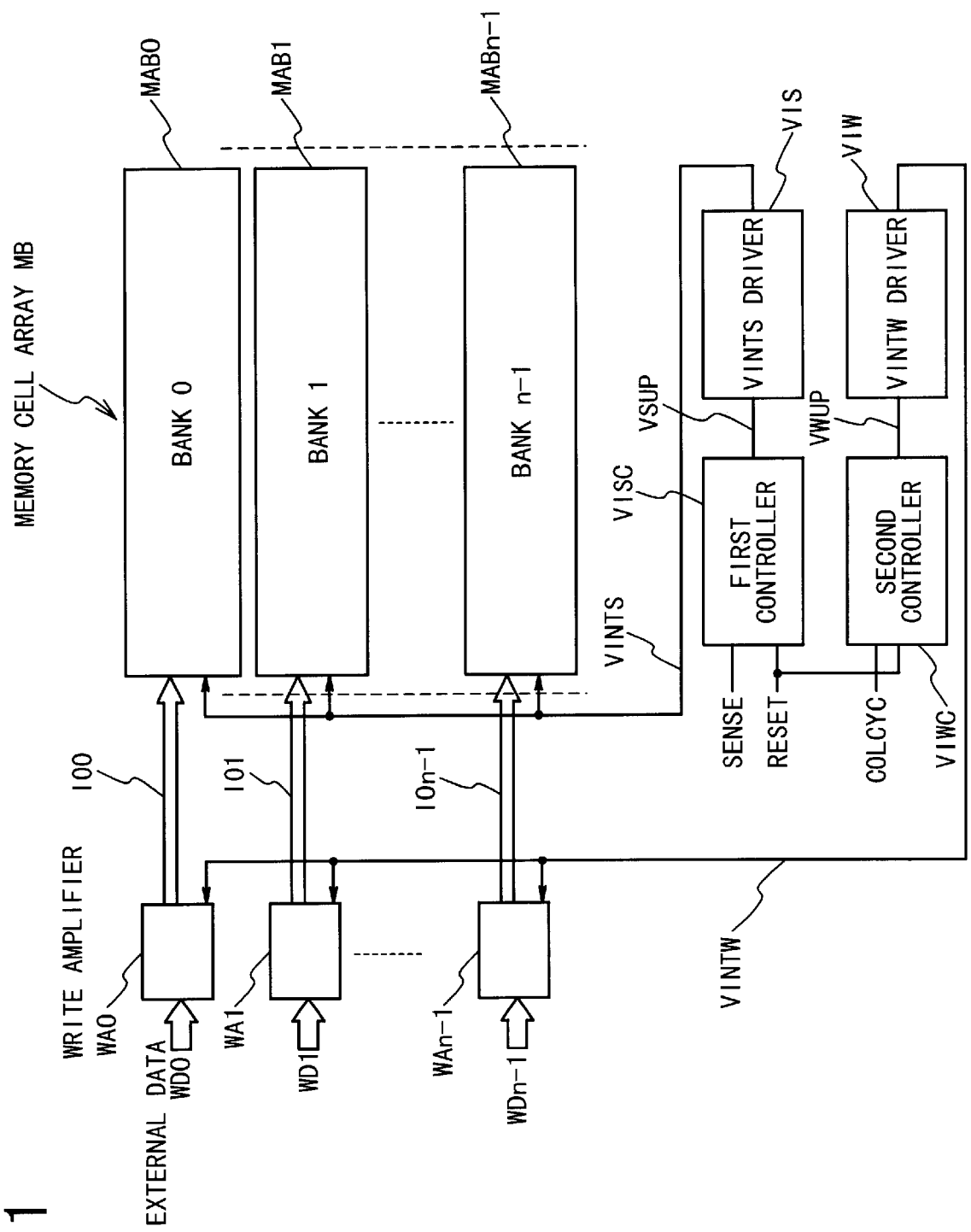
FIG. 1 is a block diagram showing an embodiment of a se conductor memory apparatus in the present invention.

FIG. 1 is a block diagram showing a flow of a write data in DRAM.

Figure 2:
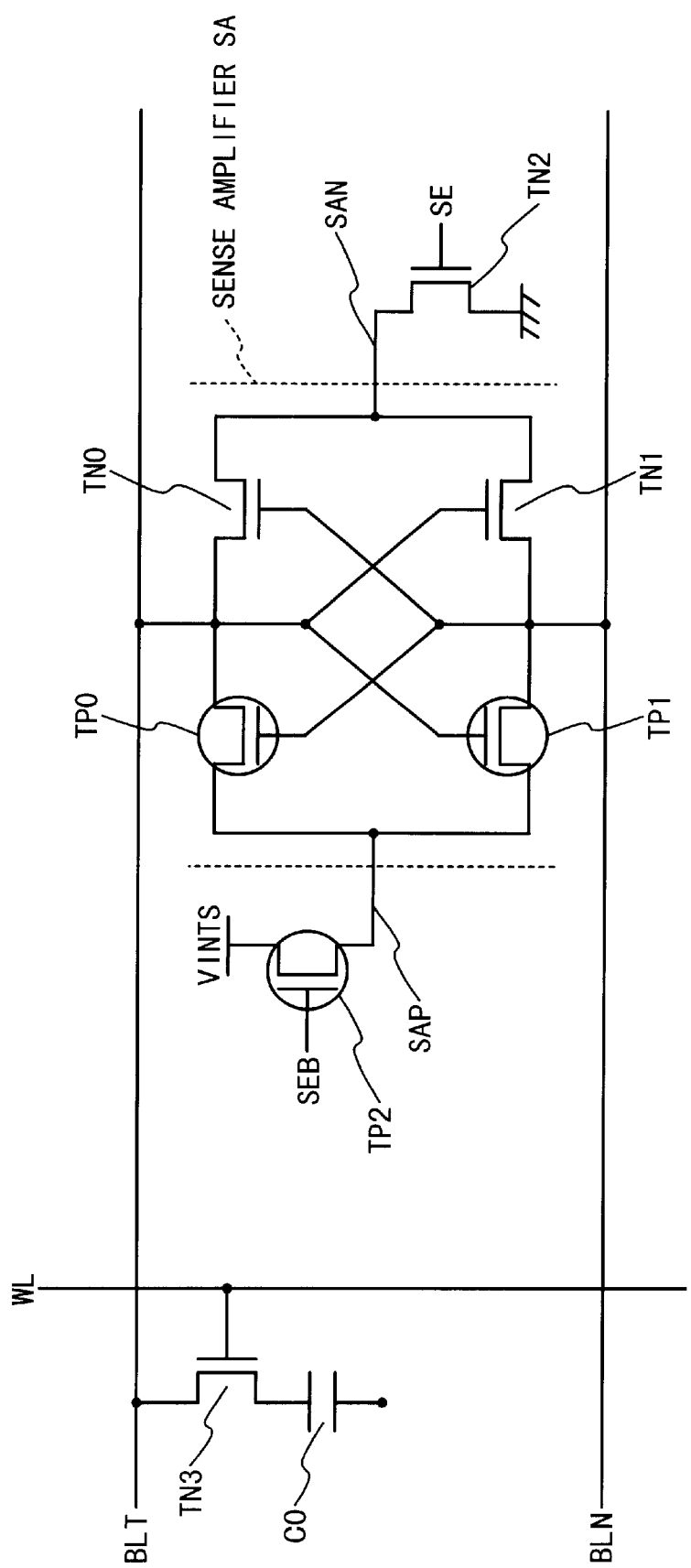
FIG. 2 is a circuit diagram showing a circuit belonging to a pair of bit lines in a memory array section of the embodiment of the semiconductor memory apparatus in the present invention.

FIG. 2 is a circuit diagram showing a circuit belonging to a pair of bit lines BLT, BLN of a memory cell array section in the DRAM.

FIG. 1 shows the DRAM as the embodiment in the present invention. This DRAM is provided with a VINTS driver VIS, a first controller VISC, a VINTW driver VIW and a second controller VIWC.

The VINTS driver VIS supplies a power supply VINTS of a sense amplifier actuation driver TP2 (refer to FIG. 2) of a memory cell array MB to a plurality of banks BANKn−1. The first controller VISC controls a power supply performance of the VINTS driver VIS. The VINTW driver VIW supplies a power supply VINTW to each of write amplifiers WAn–1 of the plurality of banks BANKn–1. The second controller VIWC controls a power supply performance of the VINTW driver VIW.

Figure 3:
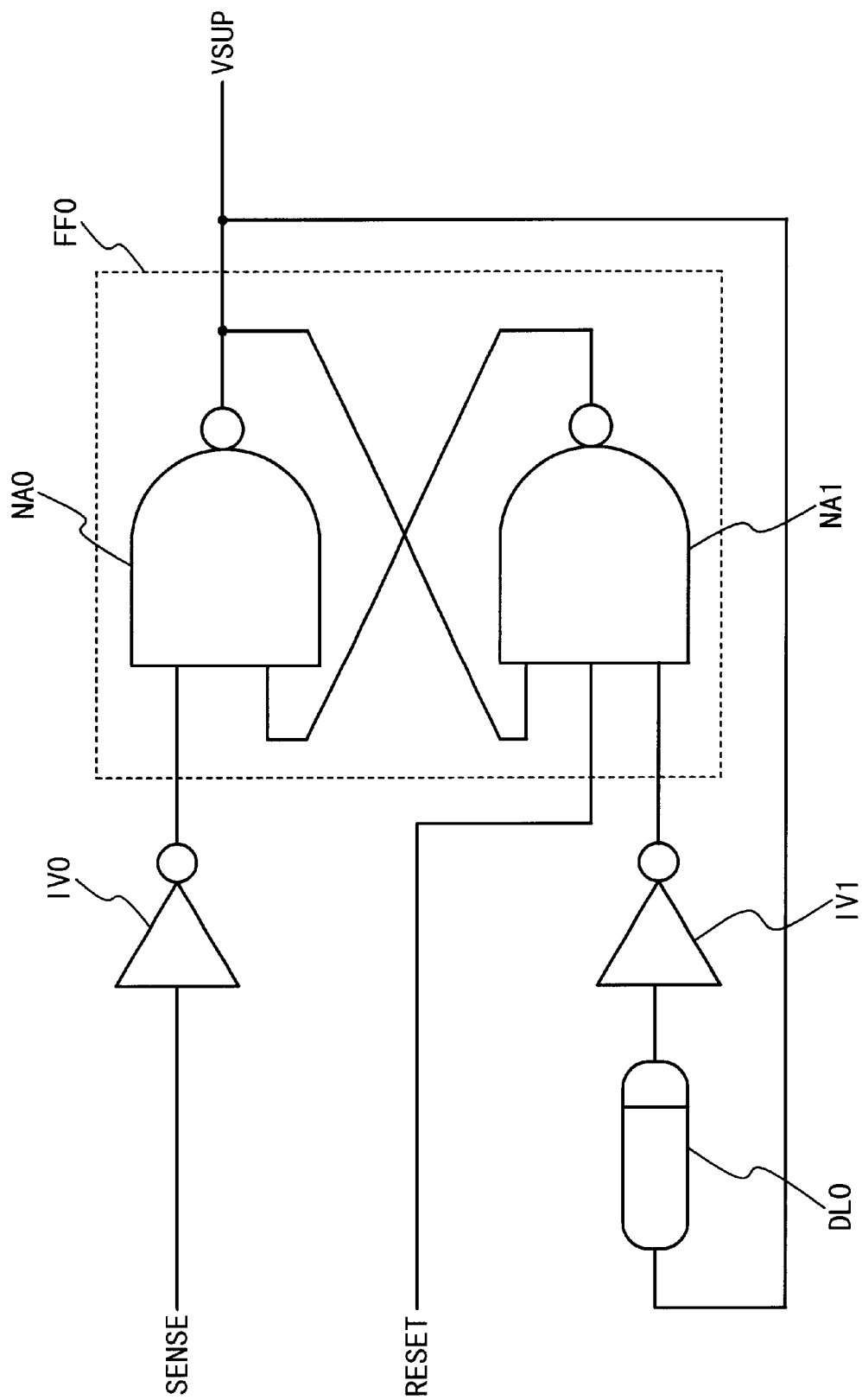
FIG. 3 is a circuit diagram showing a VINTS controller of the embodiment of the semiconductor memory apparatus in the present invention.

FIG. 3 shows one configuration example of the VINTS controller (the first controller) VISC. The first controller VISC is provided with: an inverter IV0 for receiving a sense start signal SENSE indicative of a start of a sense operation carried out by the sense amplifier SA; a flip-flop circuit FF0 having two NAND circuits NA0, NA1; a delay element DL0 for receiving a control signal VSUP; and an inverter IV1 for receiving an output signal from the delay element DL0.

The NAND circuit NA0 receives an output signal from the inverter IV0 and an output signal from the NAND circuit NA1 to output the control signal VSUP. The NAND circuit NA1 receives the output signal VSUP from the NAND circuit NA0, an output signal from the inverter IV1 and a reset signal RESET to set an initial state of the flip-flop circuit FF0.

In this VINTS controller VISC, when the high level signal is inputted as the sense start signal SENSE, the output signal (the control signal) VSUP to improve the supply performance of the VINTS driver VIS becomes at the high level, through the inverter IV0 and the flip-flop circuit FF0.

Also, the output signal VSUP is fed back to the flip-flop circuit FF0 through the inverter IV1 and the delay element DL0 having a delay time adjusted in a period from a start of the sense operation to a completion of the sense operation. As a result, the output signal VSUP becomes at the low level.

Also, the reset signal RESET to determine the initial state is inputted to the flip-flop circuit FF0.

Figure 4:
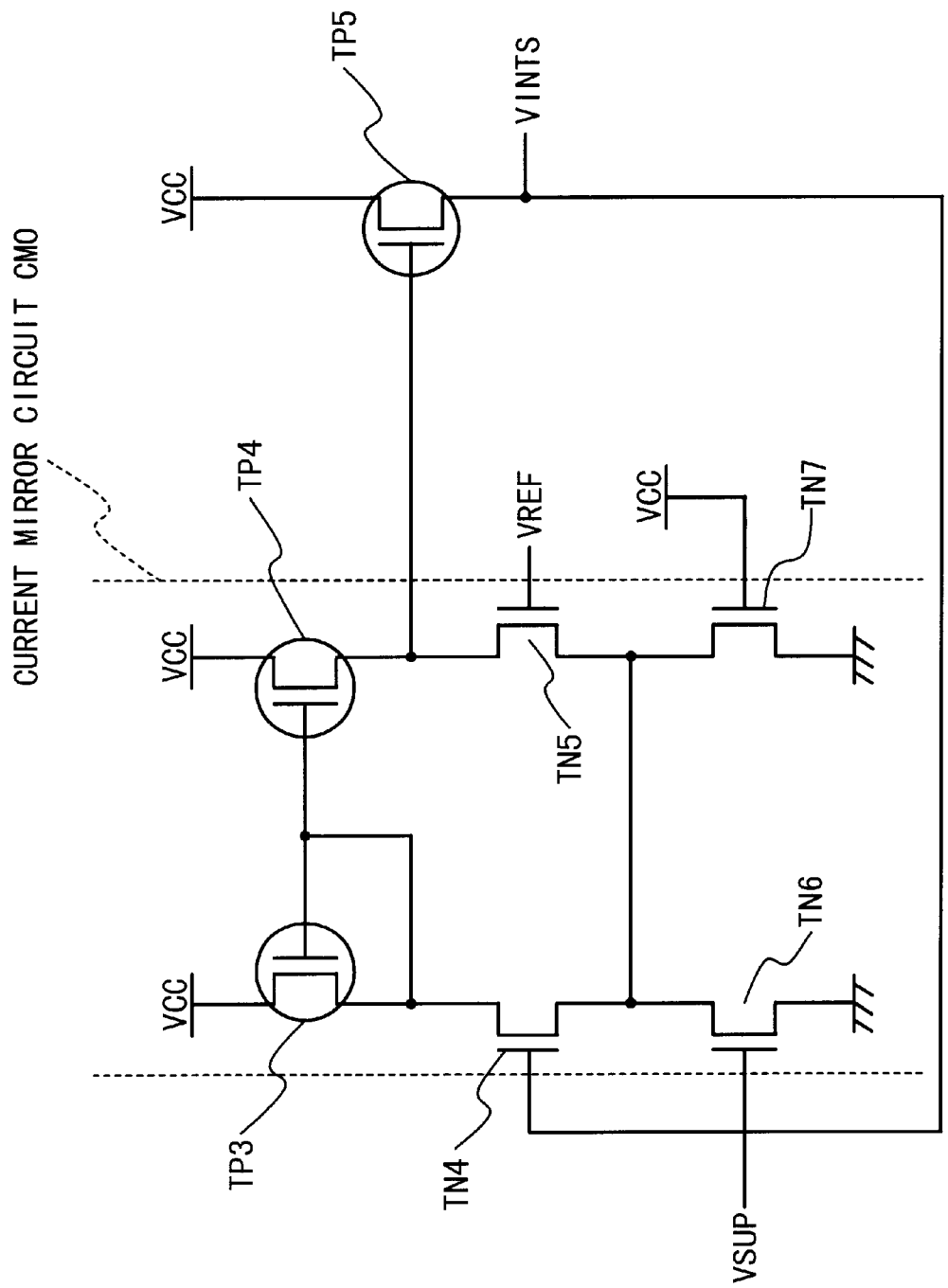
FIG. 4 is a circuit diagram showing a VINTS driver of the embodiment of the semiconductor memory apparatus in the present invention.

FIG. 4 shows one configuration example of the VINTS driver VIS. The VINTS driver VIS supplies a step-down power supply from an external power supply VCC, as the power supply voltage VINTS. The VINTS driver VIS is composed of a current mirror circuit CM0 and a p-type MOS transistor TP5 for driving the power supply VINTS. The current mirror circuit CM0 is composed of p-type MOS transistors TP3, TP4 and n-type MOS transistors TN4, TN5, TN6 and TN7.

In the p-type MOS transistor TP3, its source is connected to the external power supply VCC, and its gate is connected to a drain of the p-type MOS transistor TP3. In the p-type MOS transistor TP4, its source is connected to the external power supply VCC, and its gate is connected to the gate of the p-type MOS transistor TP3. In the n-type MOS transistor TN4, its drain is connected to the drain of the p-type MOS transistor TP3. In the n-type MOS transistor TN5, its drain is connected to a drain of the p-type MOS transistor TP4, its gate is connected to a reference potential VREF of the power supply voltage VINTS, and its source is connected to a source of the n-type MOS transistor TN4.

In the n-type MOS transistor TN6, its drain is connected to the source of the n-type MOS transistor TN4, its gate receives the control signal VSUP, and its source is connected to the ground.

In the n-type MOS transistor TN7, its drain is connected to the source of the n-type MOS transistor TN5, its gate is connected to the external power supply VCC, and its source is connected to the ground.

In the p-type MOS transistor TP5, its source is connected to the external power supply VCC, its gate is connected to the drain of the p-type MOS transistor TP4, its drain is connected to a gate of the n-type MOS transistor TN4. The p-type MOS transistor TP5 outputs the power supply voltage VINTS.

The voltage VREF inputted to the gate of the n-type MOS transistor TN5 is the reference potential of the power supply VINTS. The n-type MOS transistor TN7 is always turned on, and intended to maintain the minimum supply performance necessary for the power supply VINTS. The n-type MOS transistor TN6 has a transistor performance greater than that of the n-type MOS transistor TN7. Then, if the control signal VSUP becomes at the high level, the n-type MOS transistor TN6 is turned on to thereby make the supply performance of the power supply VINTS higher.

Figure 5:
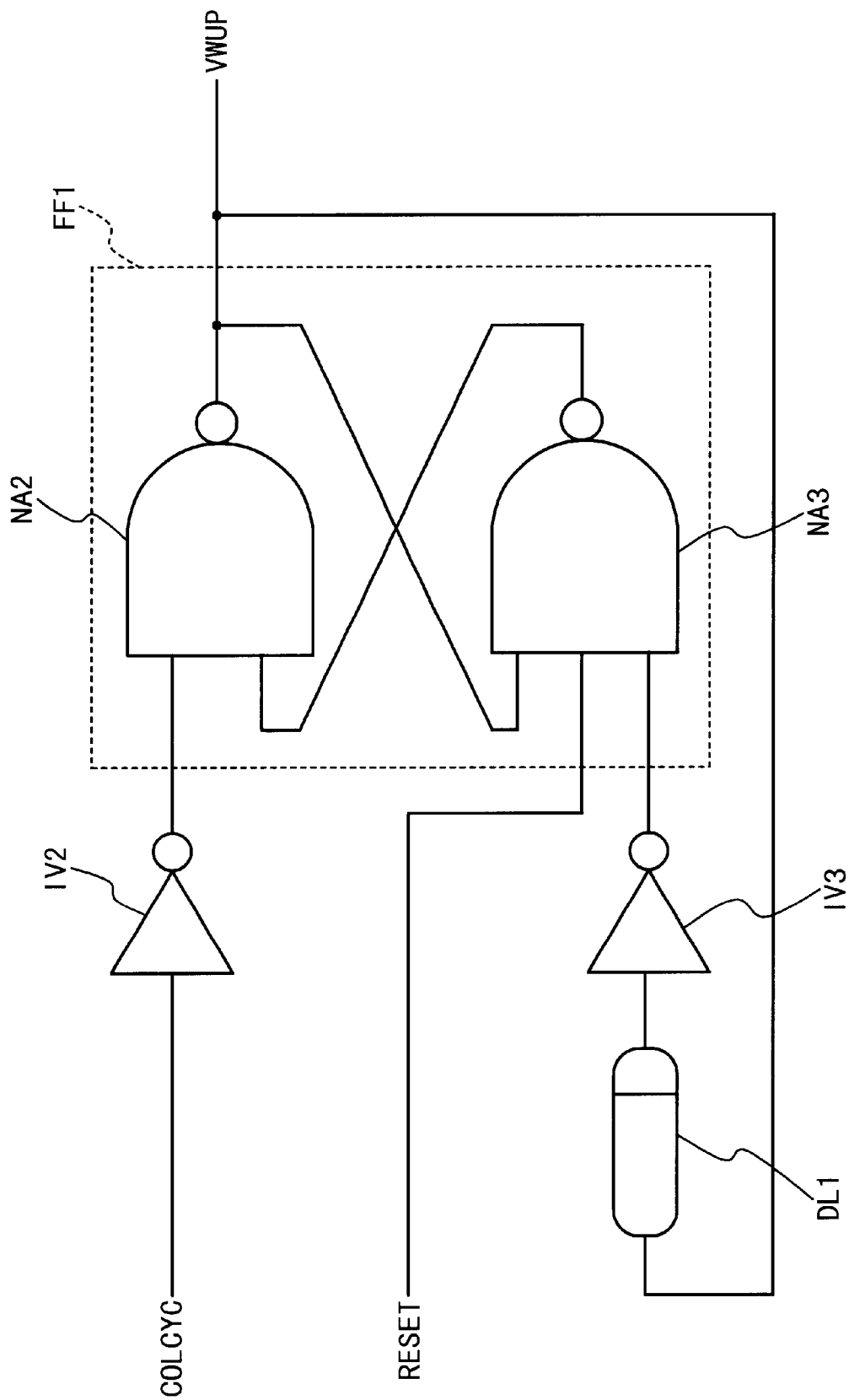
FIG. 5 is a circuit diagram showing a VINTW controller of the embodiment of the semiconductor memory apparatus in the present invention.

FIG. 5 shows one configuration example of the VINTW controller (the second controller) VIWC.

The VINTW controller VIWC is provided with: an inverter IV2 for receiving a column start signal COLCYC indicative of a start of a write and read operation to be carried out by the write amplifier WAn–1; a flip-flop circuit FF1 having two NAND circuits NA2, NA3; a delay element DL1 for receiving a control signal VWUP; and an inverter IV3 for receiving an output signal from the delay element DL1.

The NAND circuit NA2 receives an output signal from the inverter IV2 and an output signal from the NAND circuit NA3 to output the control signal VWUP. The NAND circuit NA3 receives the output signal VWUP from the NAND circuit NA2, an output signal from the inverter IV3 and the reset signal RESET to set an initial state of the flip-flop circuit FF1.

In this VINTW controller VIWC, when the column start signal COLCYC is inputted, the output signal VWUP to improve the supply performance of the VINTW driver VIW becomes active, through the inverter IV2 and the flip-flop circuit FF1.

Also, the output signal VWUP is fed back to the flip-flop circuit FF1 through the inverter IV3 and the delay element DL1 having a delay time adjusted in a period until the end of a pre-charge in a data bus IOn–1, after the completion of the write and read operation from the column start. As a result, the output signal VWUP becomes inactive.

Also, the reset signal RESET to determine the initial state is inputted to the flip-flop circuit FF1.

Figure 6:
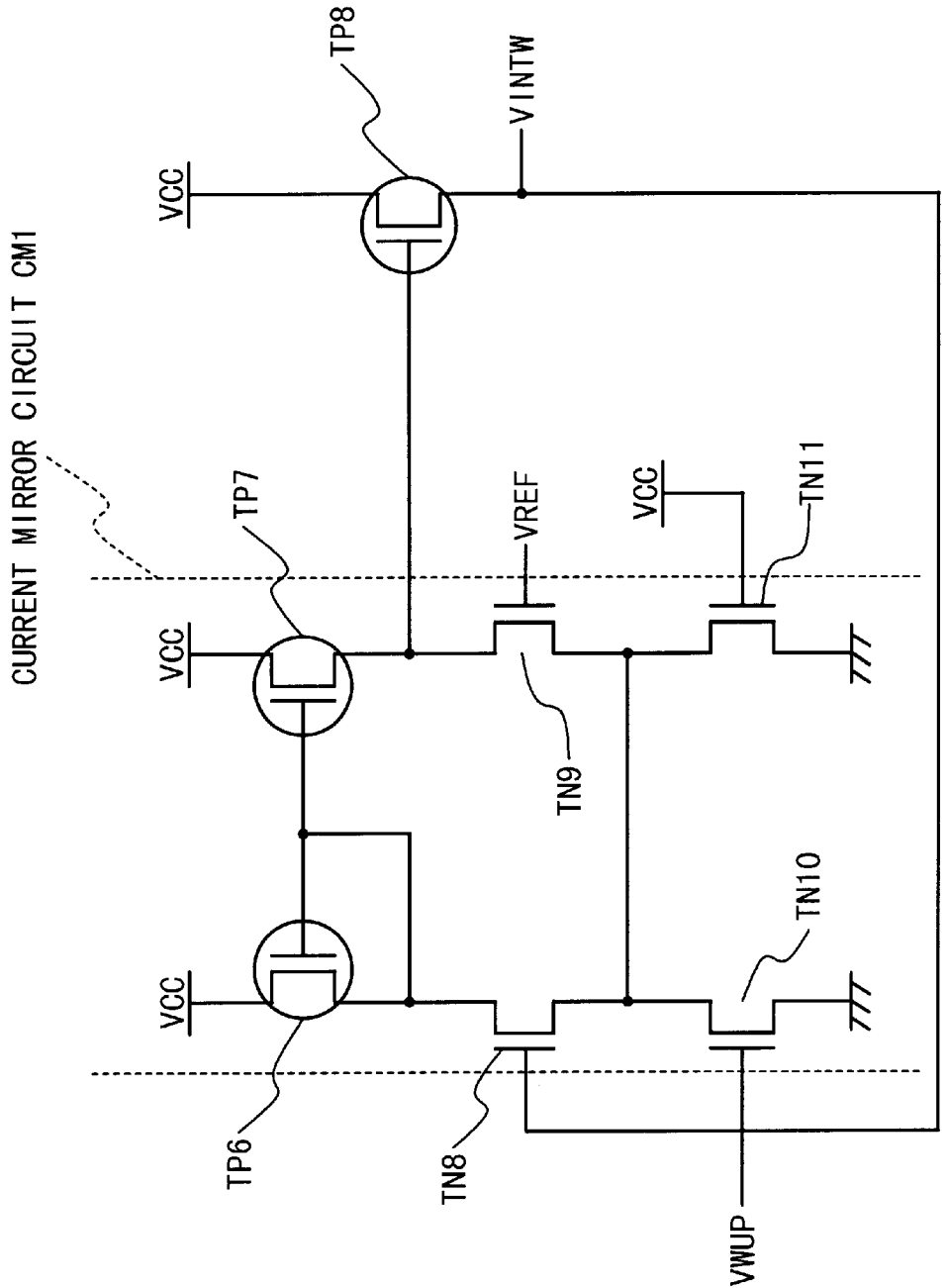
FIG. 6 is a circuit diagram showing a VINTW driver of the embodiment of the semiconductor memory apparatus in the present invention.

FIG. 6 shows one embodiment of the VINTW driver VIW. The VINTW driver VIW supplies a step-down power supply from the external power supply VCC, as the power supply voltage VINTW. The VINTW driver VIW is composed of a current mirror circuit CM1 and a p-type MOS transistor TP8 for driving the power supply VINTW. The current mirror circuit CM1 is composed of p-type MOS transistors TP6, TP7 and n-type MOS transistors TN8, TN9, TN10 and TN11.

In the p-type MOS transistor TP6, its source is connected to the external power supply VCC, and its gate is connected to a drain of the p-type MOS transistor TP6. In the p-type MOS transistor TP7, its source is connected to the external power supply VCC, and its gate is connected to the gate of the p-type MOS transistor TP6. In the n-type MOS transistor TN8, its drain is connected to the drain of the p-type MOS transistor TP6. In the n-type MOS transistor TN9, its drain is connected to a drain of the p-type MOS transistor TP7, its gate is connected to a reference potential VREF of the power supply voltage VINTW, and its source is connected to a source of the n-type MOS transistor TN8.

In the n-type MOS transistor TN10, its drain is connected to the source of the n-type MOS transistor TN8, its gate receives the control signal VWUP, and its source is connected to the ground.

In the n-type MOS transistor TN11, its drain is connected to the source of the n-type MOS transistor TN9, its gate is connected to the external power supply VCC, and its source is connected to the ground.

In the p-type MOS transistor TP8, its source is connected to the external power supply VCC, its gate is connected to the drain of the p-type MOS transistor TP7, its drain is connected to a gate of the n-type MOS transistor TN8. The p-type MOS transistor TP8 outputs the power supply voltage VINTW.

The voltage VREF inputted to the gate of the n-type MOS transistor TN9 is the reference potential of the power supply VINTW. The n-type MOS transistor TN11 is always turned on, and intended to maintain the minimum supply performance necessary for the power supply VINTW. The n-type MOS transistor TN10 has a transistor performance greater than that of the n-type MOS transistor TN11. Then, if the control signal VWUP becomes at the high level, the n-type MOS transistor TN10 is turned on to thereby make the supply performance of the power supply VINTW higher.

From the viewpoints of the above-mentioned explanation, in the memory apparatus shown in FIG. 1, the supply performance of the power supply VINTS is high until the sense completion after the sense start signal SENSE becomes active. Also, the supply performance of the power supply VINTW becomes high in the period until the end of the pre-charge in the data bus IOn−1 after the column start signal COLCYC becomes active.

Thus, in those power supplies VINTS and VINTW, the supply performances thereof are made higher independently of each other.

The memory operations in this embodiment will be described below with reference to a timing chart of FIGS. 7A to 7E.

At first, one shot of the reset signal RESET at the low level is inputted in order to determine the initial states of the flip-flop circuit FF0 in the VINTS controller VISC and the flip-flop circuit FF1 in the VINTW controller VIWC.

Next, when the sense start signal SENSE becomes high, the control signal VSUP becomes at the high level in response to the rising edge of the sense start signal SENSE. The supply performance of the power supply VINTS is made higher by the VINTS driver VIS.

After that, after the delay time of the delay element DL0, the control signal VSUP becomes at the low level to thereby drop the supply performance of the power supply VINTS. Also, in succession, if the sense start signal SENSE is inputted to the same bank BANKn−1 or another bank BANKn−1, the control signal VSUP becomes at the low level after the delay time of the delay element DL0 from the rise of the finally inputted sense start signal SENSE.

On the other hand, if the column start signal COLCYC becomes high, the control signal VWUP is made at the high level in response to the rise of the column start signal COLCYC, and the supply performance of the power supply VINTW is increased by the VINTW driver VIW. Also, if the column start signal COLCYC is continuously inputted, after the delay time of the delay element DL1 from the rise of the finally inputted column start signal COLCYC, the control signal VWUP becomes at the low level to thereby drop the supply performance of the power supply VINTW.

This embodiment as described above can provide the following effect.

The power supply for the sense amplifier and the power supply for the write amplifier are separately supplied. Thus, even if the operation of the write amplifier at the time of the sense operation causes the inner power supply level to be reduced, it has no influence on the power supply for the sense amplifier. Hence, it is possible to prevent the write level of the data to the memory cell from dropping.

As a result, a sense speed at the cell can be made faster at a next cycle.

In the power supply for the sense amplifier, the supply performance of the power supply is reduced except the period until the end of the sense operation after the input of the sense start signal. In the power supply for the write amplifier, the supply performance of the power supply is reduced except the column active case. Thus, it is possible to reduce the consumptive current in the power supply circuit having the large current consumption.

According to the semiconductor memory apparatus in the present invention, the drop of the write level to the memory cell of the data can be protected to thereby improve the sense speed at the next cycle.

What is claimed is:

1. A semiconductor memory apparatus, comprising:
   a memory cell array section;
   a first power supply generating circuit supplying a first power supply voltage of said memory cell array section;
   a second power supply generating circuit supplying a second power supply voltage of a write amplifier transmitting a write data to said memory cell array section, and
   wherein said first power supply generating circuit and said second power supply generating circuit are independent of each other; and
   wherein said first power supply generating circuit controls a supplying amount of said first power supply voltage in response to a first control signal; and
   wherein said first power supply generating circuit supplies a step-down voltage from an external power supply as said first power supply voltage and includes a first current mirror circuit and a first output transistor, and
   wherein said first current mirror circuit has first, second, third, fourth, fifth, and sixth transistors, each of said first, second, third, fourth, fifth, and sixth transistors having first and second electrodes and a control electrode, and
   wherein said second electrode of said first transistor is connected to said external power supply and said control electrode of said first transistor is connected to said first electrode of said first transistor, and
   wherein said second electrode of said second transistor is connected to said external power supply and said control electrode of said second transistor is connected to said control electrode of said first transistor, and
   wherein said first electrode of said third transistor is connected to said first electrode of said first transistor, and
   wherein said first electrode of said fourth transistor is connected to said first electrode of said second transistor and said control electrode of said fourth transistor is connected to a reference voltage of said first power supply voltage and said second electrode of said fourth transistor is connected to said second electrode of said third transistor, and
   wherein said first electrode of said fifth transistor is connected to said second electrode of said third transistor and said control electrode of said fifth transistor inputs said first control signal and said second electrode of said fifth transistor is connected to a first potential, and wherein said first electrode of said sixth transistor is connected to said second electrode of said fourth transistor and said control electrode of said sixth transistor is connected to said external power supply and said second electrode of said sixth transistor is connected to said first potential, and wherein said second electrode of said first output transistor is connected to said external power supply and said control electrode of said first output transistor is connected to said first electrode of said second transistor and said first electrode of said first output transistor is connected to said control electrode of said third transistor to output said first power supply voltage, and wherein a transistor size of said fifth transistor is different from a transistor size of said sixth transistor.

2. The semiconductor memory apparatus according to claim 1, wherein said memory cell array section includes a plurality of banks, and wherein said first power supply generating circuit supplies said first power supply voltage to a driver actuating a sense amplifier provided with each of said plurality of banks, and wherein said second power supply generating circuit supplies said second power supply voltage to said write amplifier provided with each of said plurality of banks.

3. The semiconductor memory apparatus according to claim 1, wherein said first power supply voltage is a step-down voltage from an external power supply.

4. The semiconductor memory apparatus according to claim 1, wherein said second power supply voltage is a step-down voltage from an external power supply and a same voltage as said first power supply voltage.

5. A semiconductor memory apparatus, comprising:

a memory cell array section;

a first power supply generating circuit supplying a first power supply voltage of said memory cell array section;

a second power supply generating circuit supplying a second power supply voltage of a write amplifier transmitting a write data to said memory cell array section, and wherein said first power supply generating circuit and said second power supply generating circuit are independent of each other; and wherein said first power supply generating circuit controls a supplying amount of said first power supply voltage in response to a first control signal; and wherein the semiconductor memory apparatus further comprises:

a first control circuit outputting said first control signal, and wherein said first control circuit comprises:

a first inverter inputting a sense start signal indicative of a start of a sense operation performed by a sense amplifier;

a first flip-flop circuit having first and second NAND circuits;

a first delay element inputting said first control signal; and a second inverter inputting an output signal from said first delay element, and wherein said first NAND circuit inputs an output signal from said first inverter and an output signal from said second NAND circuit to output said first control signal, and wherein said second NAND circuit inputs said first control signal outputted from said first NAND circuit, an output signal from said second inverter and a reset signal to set an initiate state of said first flip-flop circuit.

6. The semiconductor memory apparatus according to claim 5, wherein said first delay element delays a signal inputted to said first delay element by a predetermined time, and wherein said predetermined time is a time that elapsed before a completion of said sense operation performed by said sense amplifier after said sense start signal is inputted to said first control circuit.

7. The semiconductor memory apparatus according to claim 1, wherein said memory cell array section includes a plurality of banks, wherein said first power supply generating circuit supplies said first power supply voltage to a driver actuating a sense amplifier provided with each of said plurality of banks, and wherein said second power supply generating circuit supplies said second power supply voltage to said write amplifier provided with each of said plurality of banks.

8. The semiconductor memory apparatus according to claim 7, wherein said first delay element delays a signal inputted to said first delay element by a predetermined time, and wherein said predetermined time is a time that elapsed before a completion of said sense operation performed by said sense amplifier after said sense start signal is inputted to said first control circuit.

9. A semiconductor memory apparatus, comprising:

a memory cell array section;

a first power supply generating circuit supplying a first power supply voltage of said memory cell array section;

a second power supply generating circuit supplying a second power supply voltage of a write amplifier transmitting a write data to said memory cell array section, and wherein said first power supply generating circuit and said second power supply generating circuit are independent of each other; and wherein said second power supply generating circuit controls a supplying amount of said second power supply voltage in response to a second control signal; and wherein the semiconductor memory apparatus further comprises:

a second control circuit outputting said second control signal, and wherein said second control circuit comprises:

a third inverter inputting a column start signal indicative of a start of a write and read operation performed by said write amplifier;

a second flip-flop circuit having third and fourth NAND circuits;

a second delay element inputting said second control signal; and a fourth inverter inputting an output signal from said second delay element, and wherein said third NAND circuit inputs an output signal from said third inverter and an output signal from said fourth NAND circuit to output said second control signal, and wherein said fourth NAND circuit inputs said second control signal outputted from said third NAND circuit, an output signal from said fourth inverter and a reset signal to set an initiate state of said second flip-flop circuit.

10. The semiconductor memory apparatus according to claim 9, wherein said second delay element delays a signal inputted to said second delay element by a preset time, and wherein said preset time is a time that elapsed before completions of said write and read operation performed by said write amplifier and a pre-charge in a data bus provided between said write amplifier and said memory cell array section after said column start signal is inputted to said second control circuit.

11. The semiconductor memory apparatus according to claim 9, wherein said memory cell array section includes a plurality of banks, wherein said first power supply generating circuit supplies said first power supply voltage to a driver actuating a sense amplifier provided with each of said plurality of banks, and wherein said second power supply generating circuit supplies said second power supply voltage to said write amplifier provided with each of said plurality of banks.

12. The semiconductor memory apparatus according to claim 11, wherein said second delay element delays a signal inputted to said second delay element by a preset time, and wherein said preset time is a time that elapsed before completions of said write and read operation performed by said write amplifier and a pre-charge in a data bus provided between said write amplifier and said memory cell array section after said column start signal is inputted to said second control circuit.

13. A semiconductor memory apparatus, comprising:

a memory cell array section;

a first power supply generating circuit supplying a first power supply voltage of said memory cell array section;

a second power supply generating circuit supplying a second power supply voltage of a write amplifier transmitting a write data to said memory cell array section, and wherein said first power supply generating circuit and said second power supply generating circuit are independent of each other; and wherein said second power supply generating circuit controls a supplying amount of said second power supply voltage in response to a second control signal; and wherein said second power supply generating circuit supplies a step-down voltage from an external power supply as said second power supply voltage and includes a second current mirror circuit and a second output transistor, and wherein said second current mirror circuit has seventh, eighth, ninth, tenth, eleventh and twelfth transistors, each of said seventh, eighth, ninth, tenth, eleventh and twelfth transistors having first and second electrodes and a control electrode, and wherein said second electrode of said seventh transistor is connected to said external power supply and said control electrode of said seventh transistor is connected to said first electrode of said seventh transistor, and wherein said second electrode of said eighth transistor is connected to said external power supply and said control electrode of said eighth transistor is connected to said control electrode of said seventh transistor, and wherein said first electrode of said ninth transistor is connected to said first electrode of said seventh transistor, and wherein said first electrode of said tenth transistor is connected to said first electrode of said eighth transistor and said control electrode of said tenth transistor is connected to a reference voltage of said second power supply voltage and said second electrode of said tenth transistor is connected to said second electrode of said ninth transistor, and wherein said first electrode of said eleventh transistor is connected to said second electrode of said ninth transistor and said control electrode of said eleventh transistor inputs said second control signal and said second electrode of said eleventh transistor is connected to a first potential, and wherein said first electrode of said twelfth transistor is connected to said second electrode of said tenth transistor and said control electrode of said twelfth transistor is connected to said external power supply and said second electrode of said twelfth transistor is connected to said first potential, and wherein said second electrode of said second output transistor is connected to said external power supply and said control electrode of said second output transistor is connected to said first electrode of said eighth transistor and said first electrode of said second output transistor is connected to said control electrode of said ninth transistor to output said second power supply voltage, and wherein a transistor size of said eleventh transistor is different from a transistor size of said twelfth transistor.

14. The semiconductor memory apparatus according to claim 13, wherein said memory cell array section includes a plurality of banks, wherein said first power supply generating circuit supplies said first power supply voltage to a driver actuating a sense amplifier provided with each of said plurality of banks, and wherein said second power supply generating circuit supplies said second power supply voltage to said write amplifier provided with each of said plurality of banks.

15. A semiconductor memory device, comprising:

a memory cell array;

a first driver supplying a first power supply voltage to said memory cell array in response to a first control signal;

a write amplifier amplifying a write data for said memory cell array;

a second driver supplying a second power supply voltage to said write amplifier in response to a second control signal, said second control signal being different from said first control signal; and wherein said second control signal is activated after said first control signal is activated.

16. The semiconductor memory device as claimed in claim 15, wherein said first control signal is produced in response to a sense start signal.

17. The semiconductor memory device as claimed in claim 15, wherein said second control signal is produced in response to a column start signal.

18. A semiconductor memory device, comprising:
a memory cell array;
a first driver supplying a first power supply voltage to said memory cell array in response to a first control signal;
a write amplifier amplifying a write data for said memory cell array;
a second driver supplying a second power supply voltage to said write amplifier in response to a second control signal, said second control signal being different from said first control signal; and
said device further comprising a first voltage control circuit to produce said first control signal in response to a sense control signal.

19. The semiconductor memory device as claimed in claim 18, said device further comprising a second voltage control circuit to produce said second control signal in response to a column control signal.

20. The semiconductor memory device as claimed in claim 19, said first and second voltage control circuits receive a reset signal to reset said first and second control signals.

21. A semiconductor memory device, comprising:
a memory cell array;
a first control circuit controlling a first power supply voltage supplied to said memory cell array in response to a first control signal;
a write amplifier amplifying a write data for said memory cell array;
a second control circuit controlling a second power supply voltage supplied to said write amplifier in response to a second control signal, said second control signal being different from said first control signal;
wherein said first control signal is a sense start signal; and
wherein said second control signal is a column start signal.

22. A semiconductor memory device, comprising:
a memory cell array;
a first control circuit controlling a first power supply voltage supplied to said memory cell array in response to a first control signal;
a write amplifier amplifying a write data for said memory cell array;
a second control circuit controlling a second power supply voltage supplied to said write amplifier in response to a second control signal, said second control signal being different from said first control signal; and
wherein said second control signal is a column start signal.

23. A semiconductor memory device, comprising:
a memory cell array;
a first control circuit controlling a first power supply voltage supplied to said memory cell array in response to a first control signal;
a write amplifier amplifying a write data for said memory cell array;
a second control circuit controlling a second power supply voltage supplied to said write amplifier in response to a second control signal, said second control signal being different from said first control signal; and
wherein said first and second control circuits receive a reset signal.

24. A semiconductor memory device, comprising:
a memory cell array;
a first control circuit controlling a first power supply voltage supplied to said memory cell array in response to a first control signal;
a write amplifier amplifying a write data for said memory cell array;
a second control circuit controlling a second power supply voltage supplied to said write amplifier in response to a second control signal, said second control signal being different from said first control signal;
wherein said first control signal is a sense start signal; and
wherein said first control circuit outputs a first control signal for controlling said first power supply voltage, and wherein said first control circuit includes a first delay element for deactivating said first control signal activated in response to said sense start signal.

25. A semiconductor memory device, comprising:
a memory cell array;
a first control circuit supplying an activated first power supply voltage to said memory cell array at a first timing;
a write amplifier amplifying a write data for said memory cell array;
a second control circuit supplying an activated second power supply voltage to said write amplifier at a second timing, said first timing being different from said second timing; and
wherein said first timing is a timing relating to a sense operation and said second timing is a timing relating to a column operation.

26. A semiconductor memory apparatus, comprising:
a memory cell array section;
a first power supply generating circuit supplying a first power supply voltage for a driver actuating a sense amplifier;
a second power supply generating circuit supplying a second power supply voltage for a write amplifier transmitting a write data from an external to said memory cell array section,
wherein said first power supply generating circuit and said second power supply generating circuit supply said first and second power supply voltages, independently of each other;
wherein the first power supply voltage and the second power supply voltage are supplied in response to separate control signals; and
wherein the semiconductor memory apparatus further comprises:
a first controller connected to said first power supply generating circuit;
a second controller connected to said second power supply generating circuit;
said separate control signals comprising first and second control signals;
said first controller connected to receive said first control signal; and
said second controller connected to receive said second control signal.

27. The semiconductor memory apparatus according to claim 26, wherein said first and second control signals activate said first and second controllers respectively for different periods of time.

* * * * *